(12) United States Patent
Kawahara et al.

(10) Patent No.: US 9,318,178 B2
(45) Date of Patent: Apr. 19, 2016

(54) SEMICONDUCTOR STORAGE DEVICE AND DATA PROCESSING METHOD

(75) Inventors: Takayuki Kawahara, Higashiyamato (JP); Riichiro Takemura, Tokyo (JP); Kazuo Ono, Hachioji (JP); Nobuaki Kohinata, Los Gatos, CA (US)

(73) Assignee: Hitachi, Ltd., Tokyo (JP)

( * ) Notice: Subject to any disclaimer, the term of this patent is extended or adjusted under 35 U.S.C. 154(b) by 780 days.

(21) Appl. No.: 13/576,913

(22) PCT Filed: Feb. 2, 2010

(86) PCT No.: PCT/JP2010/051443
§ 371 (c)(1),
(2), (4) Date: Oct. 24, 2012

(87) PCT Pub. No.: WO2011/096047
PCT Pub. Date: Aug. 11, 2011

(65) Prior Publication Data
US 2013/0033928 A1    Feb. 7, 2013

(51) Int. Cl.
*G11C 11/00* (2006.01)
*G11C 11/15* (2006.01)
*G11C 11/16* (2006.01)

(52) U.S. Cl.
CPC ............... *G11C 11/15* (2013.01); *G11C 11/16* (2013.01)

(58) Field of Classification Search
CPC ................................ G11C 11/15; G11C 11/16
USPC .................................................. 365/158, 156
See application file for complete search history.

(56) References Cited

U.S. PATENT DOCUMENTS

| | | | |
|---|---|---|---|
| 6,785,158 B2 | 8/2004 | Nagashima | |
| 7,239,542 B2 | 7/2007 | Ootsuka et al. | |
| 7,353,324 B2 | 4/2008 | Tanaka | |
| 7,835,173 B2 * | 11/2010 | Ma et al. | 365/148 |
| 7,958,287 B2 | 6/2011 | Tanaka | |

(Continued)

FOREIGN PATENT DOCUMENTS

| | | |
|---|---|---|
| JP | 11-306786 A | 11/1999 |
| JP | 2003-331575 A | 11/2003 |

(Continued)

OTHER PUBLICATIONS

R. Takemura et al., "32-Mb 2T1R SPRAM with localized bi-directional write driver and '1'/'0' dual-array equalized reference cell", 2009 Symposium on VLSI Circuits, Digest of Technical Papers, pp. 84-85, Jun. 2009.

(Continued)

*Primary Examiner* — Richard Elms
*Assistant Examiner* — Mohammed A Bashar
(74) *Attorney, Agent, or Firm* — Miles & Stockbridge P.C.

(57) ABSTRACT

Since a nonvolatile RAM allows random reading and writing operations, an erasing mode is unnecessary. From the system side, however, it is desirable to have the erasing mode because of its nonvolatile characteristic. Moreover, the erasing operation is desirably carried out at high speed with low power consumption. Therefore, memory cell arrays COA and DTA containing a plurality of memory cells MC each having a magnetoresistive element are provided, a series of data is written to the memory cell arrays COA and DTA, and at the time of erasing, an erasing operation is carried out by writing predetermined data only to the memory cell array COA.

21 Claims, 16 Drawing Sheets

(56) References Cited

U.S. PATENT DOCUMENTS

| | | |
|---|---|---|
| 7,958,288 B2 | 6/2011 | Tanaka |
| 7,996,634 B2 | 8/2011 | Tanaka |
| 8,001,337 B2 | 8/2011 | Tanaka |
| 8,332,957 B2 | 12/2012 | Hayasaka |
| 8,397,035 B2 | 3/2013 | Tanaka |
| 2003/0214834 A1 | 11/2003 | Nagashima |
| 2006/0050552 A1* | 3/2006 | Perner ............ 365/171 |
| 2011/0060872 A1 | 3/2011 | Tanaka |
| 2013/0145090 A1 | 6/2013 | Tanaka |

FOREIGN PATENT DOCUMENTS

| | | |
|---|---|---|
| JP | 2005-108304 A | 4/2005 |
| JP | 2006-108515 A | 4/2006 |
| JP | 2006-252021 A | 9/2006 |
| JP | 2007-250101 A | 9/2007 |
| JP | 2008-171565 A | 7/2008 |
| JP | 2008-198311 A | 8/2008 |
| JP | 2008-242603 A | 10/2008 |

OTHER PUBLICATIONS

Takayuki Kawahara et al., "2 Mb SPRAM (Spin-Transfer Torque RAM) With Bit-by-BIT Bi Directional Current Write and Parallelizing-Direction Current Read", IEEE Journal of Solid-State Circuits, vol. 43, pp. 109-120, Jan. 2008.

* cited by examiner

Parallel

Anti-parallel

CPU EQUIPPED WITH SPRAM    FPGA EQUIPPED WITH SPRAM    SSD OR OTHERS

CPU/FPGA EQUIPPED WITH SPRAM    SPRAM    SSD OR OTHERS

CAPACITOR ELEMENT

Anti-parallel

Parallel

SEMICONDUCTOR STORAGE DEVICE AND DATA PROCESSING METHOD

TECHNICAL FIELD

The present invention relates to a semiconductor storage device, and more particularly to a system having an erasing mode and an erasing method thereof in a memory utilizing magnetoresistance change.

BACKGROUND ART

Among nonvolatile memories, an MRAM (Magnetoresistive Random Access Memory) and an SPRAM (Spin Transfer Torque RAM) which are memories utilizing magnetoresistance change are capable of a high-speed operation, and have a possibility of forming a nonvolatile RAM that can be rewritten a practically unlimited number of times. As shown in a circuit diagram of FIG. 21A, the cell of the SPRAM described in Non-Patent Document 1 and Non-Patent Document 2 is constituted by one tunnel magnetoresistive element TMR, a selection transistor MCT, a word line WL, a bit lie BL, and a source line SL. FIG. 21B shows an example of a cross-sectional structure thereof. As shown in FIG. 22, the tunnel magnetoresistive element TMR has at least two magnetic layers, and one of them is a pinned layer PL in which a spin direction is fixed and the other is a free layer FL in which the spin direction takes two states relative to the pinned layer, that is, a parallel state and an anti-parallel state. A tunnel barrier film TB is disposed between these films. The information storage is achieved based on the spin directions in this free layer, and in the case of the anti-parallel state (AP) relative to the pinned layer of FIG. 22A, the electric resistance of the tunnel magnetoresistive element becomes a high resistance state, while in the case of the parallel state (P) of FIG. 22B, it becomes a low resistance state. These states are assigned to "0" and "1" of the information. In a reading operation, the magnitude of the resistance of the tunnel magnetoresistive element TMR is read to obtain the stored information. In a rewriting operation, the spin direction of the free layer can be controlled by an electric current in a direction perpendicular to the pinned layer PL, the tunnel barrier film TB, and the free layer FL. More specifically, when an electric current is applied in a direction from the pinned layer PL to the free layer FL, electrons having a spin direction that makes the direction of magnetization of the free layer reverse to that of the pinned layer PL mainly flow toward the free layer FL. For this reason, when this current value exceeds a predetermined threshold value, the directions of magnetization of the pinned layer PL and the free layer FL become anti-parallel to each other. In contrast, when an electric current is applied in a direction from the free layer FL to the pinned layer PL, electrons having a spin direction that makes the direction of magnetization of the free layer equal to that of the pinned layer PL mainly flow toward the free layer FL. When this current value exceeds a predetermined threshold value, the directions of magnetization of the pinned layer PL and the free layer FL become parallel to each other. More specifically, in this memory, the information "0" and the information "1" are written separately based on the directions of the electric current. In the case when this system is used, since the electric current (threshold value) required for rewriting is proportional to the size of the tunnel magnetoresistive element TMR, miniaturization and reduction in the rewriting current can be achieved, so that this method is superior in scalability. For the tunnel barrier film TB, a material such as MgO can be used.

As described in Non-Patent Documents 1 and 2, the feature of this memory is that information is not lost even when a power supply is shut off, that is, the memory is nonvolatile. Moreover, in comparison with the flash memory, this memory has an extremely large number of rewritable times, and can be continuously rewritten unlimitedly for 10 years. In other words, it can be used in the same manner as the DRAM and SRAM. Moreover, like the DRAM and SRAM, this memory can carry out reading and writing operations of "1" information and "0" information at random places in the same period of time. The flash memory does not have these functions, and even a memory cell that stores binary numbers carries out divided operations, that is, an operation referred to as an erasing operation in which memory cells in a certain region are entirely brought into, for example, a memory state of "0" and an operation referred to as a writing operation in which specified memory cells among these memory cells in an erased state are brought into a memory state of "1". These asymmetric operations are not required in the MRAM and SPRAM. Although this memory is capable of carrying out the same operations as those of the SRAM and DRAM, it is also nonvolatile like the flash memory. Therefore, it is not necessary to selectively use the volatile SRAM and DRAM and the nonvolatile flash memory unlike the conventional case, and it becomes possible to reduce the number of parts and also to make the hierarchical levels of the memory control shallower.

PRIOR ART DOCUMENTS

Non-Patent Documents

Non-Patent Document 1: 2009 Symposium on VLSI Circuits, Digest of Technical Papers, pp. 84-85, June 2009

Non-Patent Document 2: IEEE Journal of Solid-State Circuits, Vol. 43, pp. 109-120, January 2008

SUMMARY OF THE INVENTION

Problems to Be Solved By the Invention

However, in a system using this memory, the fact that the past information of the memory is left is sometimes undesirable from the viewpoint of security. In the case of a conventional flash memory, an unwritten state can be achieved by carrying out an erasing operation in this region. However, in the MRAM and SPRAM, it is originally unnecessary to separately provide the erasing operation because the same operation as that of the SRAM and DRAM is available. For the system, however, since information is left due to nonvolatile characteristics, it becomes necessary to carry out an erasing operation for a necessary region. Since this memory can carry out completely the same operations as those of the SRAM and DRAM and at the same time it is nonvolatile, it has the problem as described above. The present invention has been devised to solve this problem.

Moreover, since it is not necessary to selectively use SRAM and DRAM that are volatile and a flash memory that is nonvolatile, a mixed use with volatile memories such as SRAM and DRAM is not appropriate as the solution of the above-mentioned problem. This memory needs to have a function of erasing stored information. Furthermore, this operation needs to be carried out with low power consumption or at high speed.

Means for Solving the Problems

Typical aspects obtained in the present invention are described below.

As a first aspect, an erasing operation is carried out by writing predetermined data to a part of memory cells to which a series of data (unit of writing) has been written. By this means, even when a reading operation is carried out after the erasing operation, only meaningless data rows are read, and high security can be achieved. Moreover, since only a part of the memory cells is rewritten, the operation can be carried out with low power consumption or at high speed.

As a second aspect, a flag bit indicating whether the current state is an erasing state or a writing state and a dummy pattern data block are provided, and when the flag bit indicates the erasing state, data output from the dummy pattern data block is output to the outside. By this means, in the case when the erasing operation is carried out, it is not necessary to change all the data, and since the information to be read out to the outside is meaningless data rows output from the dummy pattern data block, it is possible to ensure high security.

As a third aspect, the memory cell array is constituted by two types of memory cells each having different information retention time, and a series of data (unit of writing) is written to the two types of memory cells in a divided manner. In this case, one type of the memory cells is preferably a volatile memory. By this means, as the time elapses (or power supply is shut off), information is partly lost, and data in unit of writing becomes meaningless data rows.

Effects of the Invention

Since a function of accepting an erasing command is provided, an operation that requires erasure can be achieved on the system side, and desired system security can be realized.

BRIEF DESCRIPTIONS OF THE DRAWINGS

BEST MODE FOR CARRYING OUT THE INVENTION

First Embodiment

Figure 1:
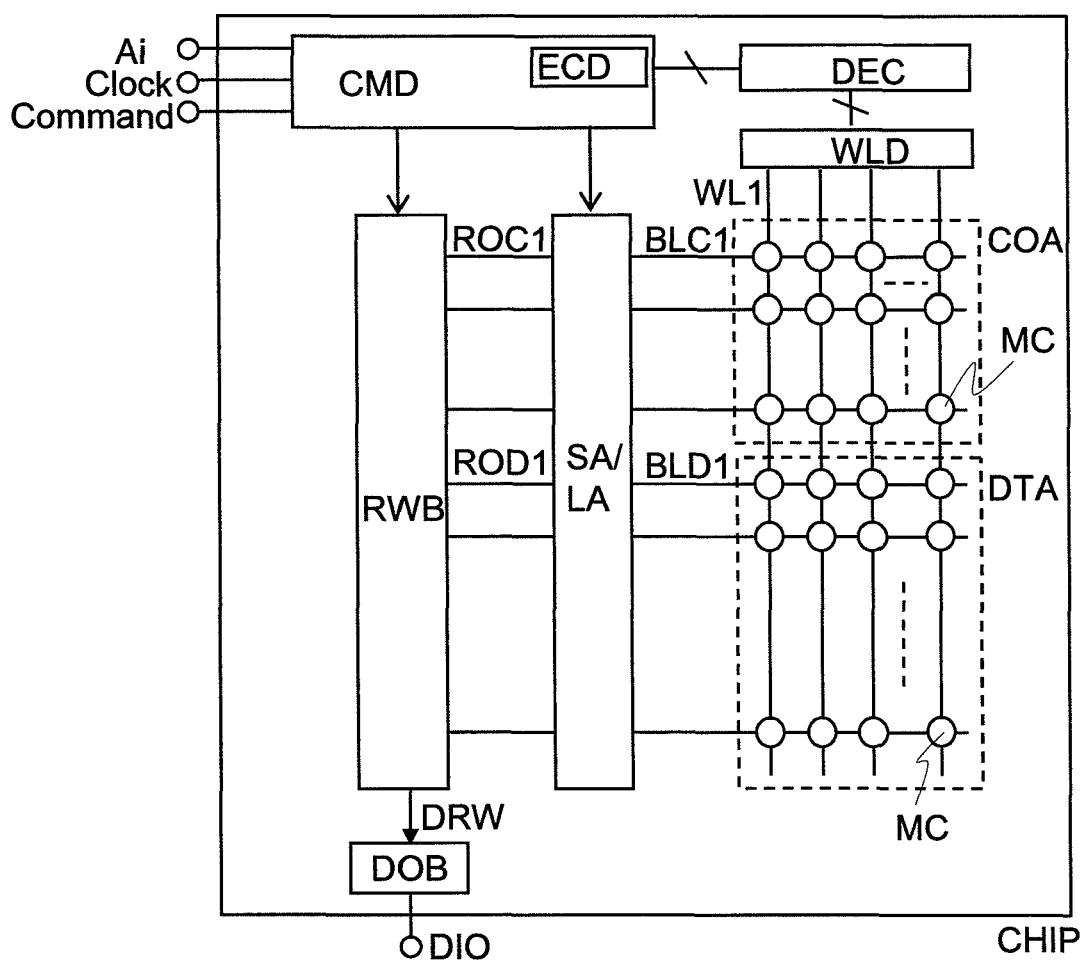
FIG. 1 is a diagram showing a first embodiment of the present invention.

A first embodiment of the present invention will be described with reference to FIG. 1. To a chip CHIP of a storage device to which the present invention is applied, at least an address signal Ai, a clock signal Clock and a command signal Command are input. The address signal specifies a memory cell to be selected, and signal transmission to and from the outside and internal operations are carried out in synchronization with the clock signal. The command signal determines a function to be executed by this chip. The command signal is given as a dedicated signal pin in some cases, or given as a combination with another signal in other cases. Although not shown in this diagram, an external power supply terminal and an inner power supply generation circuit derived from the terminal are provided. The address signal Ai, the clock signal Clock and the command signal Command are input to a command control circuit CMD. The command control circuit CMD receives a writing command specified by the address signal Ai and the command signal Command, and controls a writing operation for writing externally input data to a memory cell. The characteristic point of the present invention lies in that an erasing operation control circuit ECD serving as a circuit block that receives a command for activating an erasing operation and controls the erasing operation is installed in the command control circuit CMD. The erasing operation control circuit ECD is constituted by an erasing command decoder unit that receives a signal from a specific signal pin (for example, a signal kept in a high level during a period in which the command is being received) to determine that the current mode is an erasing mode or determine that the current mode is an erasing mode in the same manner based on a combination of a plurality of signals, an erasing operation control unit that receives the erasing command to generate necessary internal signals, and others.

With respect to the memory cell array composed of memory cells MC described in the prior art, the present invention is characterized in that the memory cell array is divided into two arrays of a first array COA and a second array DTA. When a writing command is input together with an address signal indicating to which memory cells the writing is carried out, the input data is written in the first array COA and the second array DTA in a divided manner, and the data stored in the first array COA and the data stored in the second array DTA form a series of data (unit of writing data), which is a characteristic of the present invention. In this case, the number of memory cells to be allocated to the array COA is preferably made smaller than the number of memory cells to be allocated to the array DTA. As described in the embodiment shown in this diagram, this can be easily realized by, for example, using one word line WL1 commonly between the two arrays and setting the number of a plurality of memory cells selected by this word line WL1 to be coincident with the unit of data to be written (for example, 256 pieces). Reference sign DEC denotes a decoder circuit that selects a desired word line based on address signals, and WLD denotes a word driver for driving the word line. Also, an example of the bit line of the first array COA is BLC1, and an example of the bit line of the second array DTA is BLD1. An amplifier for amplifying the signal of this bit line or a circuit block for latching writing data to be sent to the bit line is SA/LA. As signal lines corresponding to an input/output control circuit RWB relating to the respective bit lines, ROC1 and ROD1 are provided. An output DRW of the input/output control circuit is connected to an input/output terminal DIO through an input/output buffer DOB.

In this manner, a series of data is written to the first array COA and the second array DTA in a divided manner, and when an erasing command is received together with an address signal indicating which memory cells are to be erased, specific data is written only to the first array COA in the present invention. The specific data is the data in which "1" and "0" are simply repeated, for example, the data all of which are "0" or all of which are "1". The present invention is characterized in that the completion of the erasing operation is determined by the writing of this data. In other words, no data writing operation is carried out to the second array DTA. Since the number of data is small in the first array COA, the sum of electric currents required for the writing operation is small, and the erasing operation defined in this chip can be completed with low electric power. Moreover, in the case of a memory in which information is written by using an electric current like in the present invention, batch writing process to memory cells selected by one word line cannot be carried out in some cases due to a limitation of a peak current. In such a case, data is sequentially written to the memory cells selected by one word line, but if the erasing operation is completed by the writing only to the first array COA like in the present invention, the erasing operation can be completed at high speed. In addition, since the series of data is written to both of the first array COA and the second array DTA (in the present embodiment, written on the basis of the unit of a single word line), only meaningless data can be obtained even when this data is read. In other words, the data region is virtually erased. Incidentally, although not particularly limited, the semiconductor integrated circuit shown in this diagram is formed on one semiconductor substrate (semiconductor chip) made of a material such as single crystal silicon based on a CMOS integrated circuit manufacturing technique.

Second Embodiment

Figure 2:
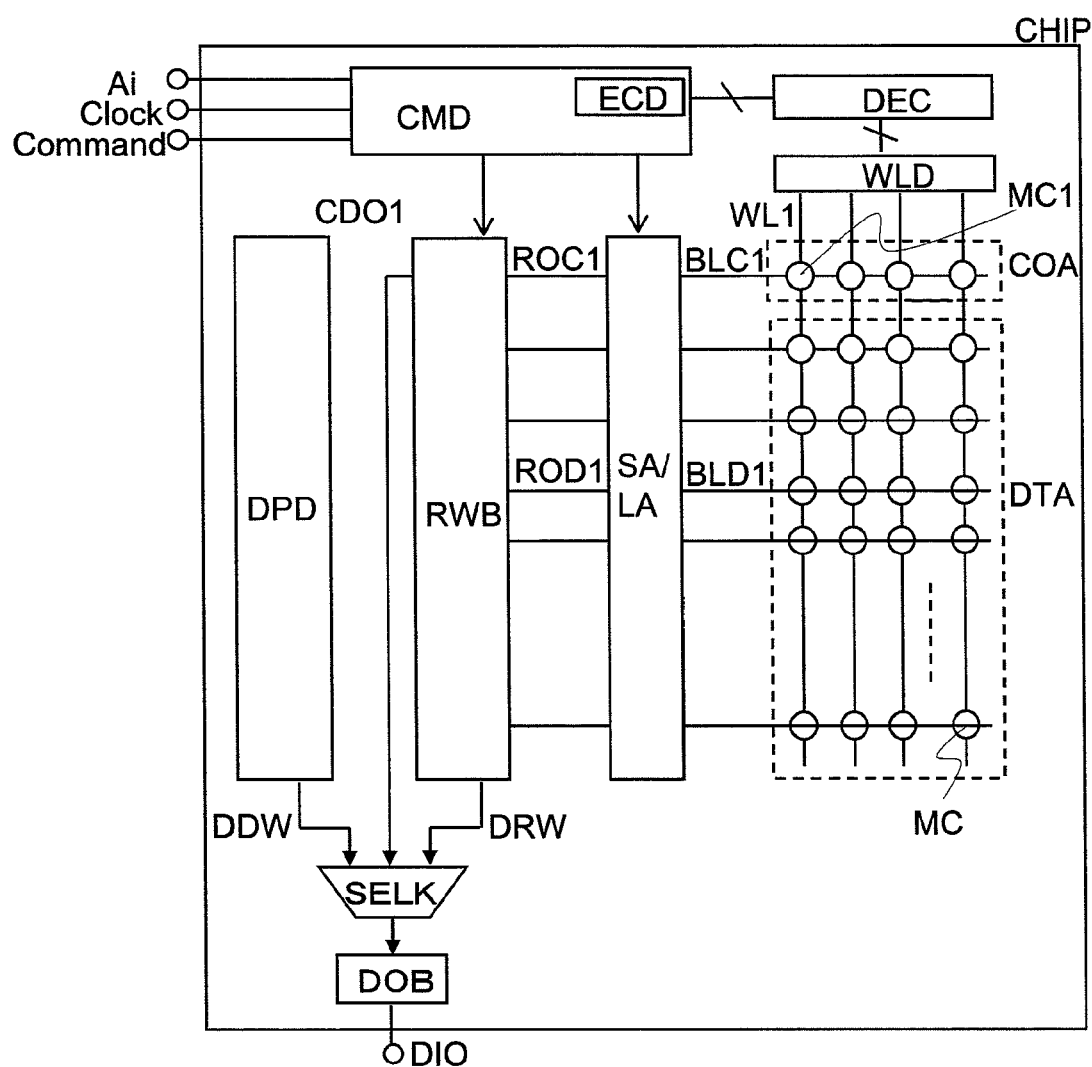
FIG. 2 is a diagram showing a second embodiment of the present invention.

FIG. 2 illustrates a second embodiment of the present invention. The difference from FIG. 1 will be mainly described below. Like the case of FIG. 1, two types of arrays COA and DTA are provided. CDO1 is an output signal corresponding to a specific address in the COA. In this case, this is defined as the data corresponding to information of a memory cell MC1 selected by a word line WL1 and a bit line BLC1. Also, a series of data is written to both of the COA and the DTA in the first embodiment, but the series of data is written only in the DTA, and the COA is used as a flag bit indicating whether or not an erasing operation has been carried out in the present embodiment.

First, in the erasing operation, for example, "0" is written only to the memory cell of the MC1 contained in the COA. By doing so, the data of the memory cells contained in the DTA connected to the word line WL1 is regarded as erased, which is a characteristic of the present invention. In this embodiment, at the time of writing, "1" is written to the memory cell of the MC1, and the input data is written to the DTA. At the time of reading, a signal corresponding to the information of "1" or "0" in the MC1 is output to the CDO1. In the present embodiment, a dummy pattern data block DPD which stores specific data is installed. This dummy pattern data block DPD outputs data that do not have any particular meaning such as repeating data of "1" and "0" or the like. The DPD is not necessarily provided as a nonvolatile device, and it may be constituted by, for example, an inverter chain having the same number of steps as the number of data of the unit of writing and be configured so that the outputs of the respective inverters can be used as dummy data. When it is constituted by the inverter chain, each of the outputs thereof forms a specific data pattern, that is, repetition of "1" and "0" in this case. Moreover, in the DPD, all the bits of data of the unit of writing may have a ground level or a stabilized high-potential power supply level. Furthermore, instead of the inverter chain, a flip-flop row may be used, or fuse means may be used to form a free signal row. Alternatively, a magnetic memory may be used as it is.

In this case, the output of the input/output control circuit is defined as DRW, and the same kind of signal output from the dummy pattern data block DPD is defined as DDW. SELK denotes a selection circuit, and this is a circuit that selects whether the output DRW of the RWB or the output DDW of the DPD is transmitted to the output buffer in accordance with the output signal of the CDO1 at the time of reading. At the time of reading, information of the memory cell is contained in the RWB, and preset information is contained in the DPD. In this case, the signal of the CDO1 is supposed to be a signal corresponding to "0" of the MC1. Therefore, the data stored in the DTA is erased. In the SELK, the signal of the output DDW of the DPD is transmitted to the output buffer. Consequently, the signal to be read out is, for example, repeating data of "1" and "0", which is erased meaningless data. As described above, the present embodiment is characterized in that the erasing operation is completed only by rewriting the data of the MC1 and is thus carried out at high speed with low power consumption. In addition, in the case when the signal of the CDO1 is a signal corresponding to "1" of the MC1, a normal reading operation is carried out.

As the determination signal like the CDO1 for selecting which of a normal data reading process or a reading process of predetermined data (corresponding to the erased state) in the SELK, various modified examples such as that formed based on a plurality of data inside the COA can be conceived. Moreover, in the present embodiment, the COA is simply used as a flag bit, but if the method in which the unit of writing data is divided and stored and only a part thereof is erased described in the first embodiment is used in combination (batch writing of predetermined data is carried out to the memory cells of COA including the flag bit), higher security can be achieved.

Third Embodiment

Figure 3:
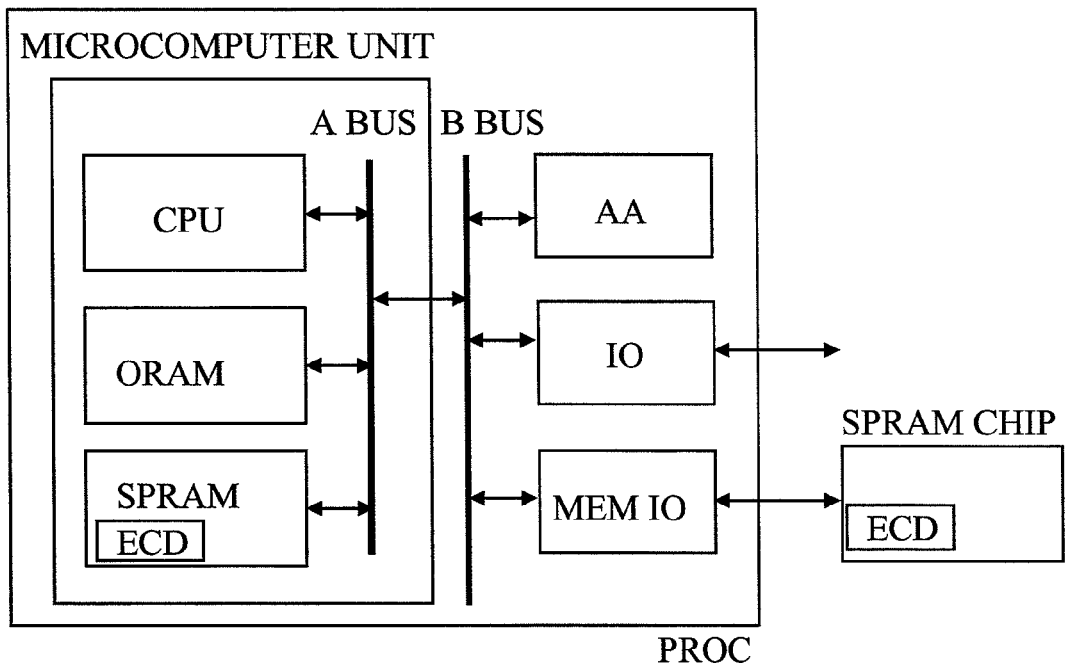
FIG. 3 is a diagram showing a third embodiment of the present invention.

FIG. 3 is a diagram showing a third embodiment of the present invention. The present embodiment is provided with a chip denoted by PROC and a chip denoted by SPRAM CHIP. The chip denoted by PROC has, for example, a microcomputer unit, an AA serving as a logical circuit unit having certain functions, an input/output circuit 10, a memory-dedicated control and input/output circuit MEM 10, and a B bus serving as a peripheral bus. This microcomputer unit is provided with a CPU (Central Processing Unit) and an SPRAM having an erasing operation control circuit ECD, and another type of memory ORAM is further installed therein in some cases. These are commonly connected to an inner bus (A bus). The structure and functions of the SPRAM provided with the erasing control block ECD are the same as those of the first or second embodiment of the present invention. Moreover, the SPRAM CHIP is connected to the MEM IO. The SPRAM CHIP has the same structure as that of the first or second embodiment of the present invention. Although not particularly limited, a timer, a counter and the like are installed as other peripheral circuit units. A desired system is assembled by using the device having the structure like this, and in the present embodiment, a memory such as the SPRAM utilizing magnetoresistance change has an erasing function, and data that needs not to be left can be freely erased in accordance with the control of the CPU. Thus, the present embodiment has a characteristic that a system superior in security can be configured.

Figure 4:
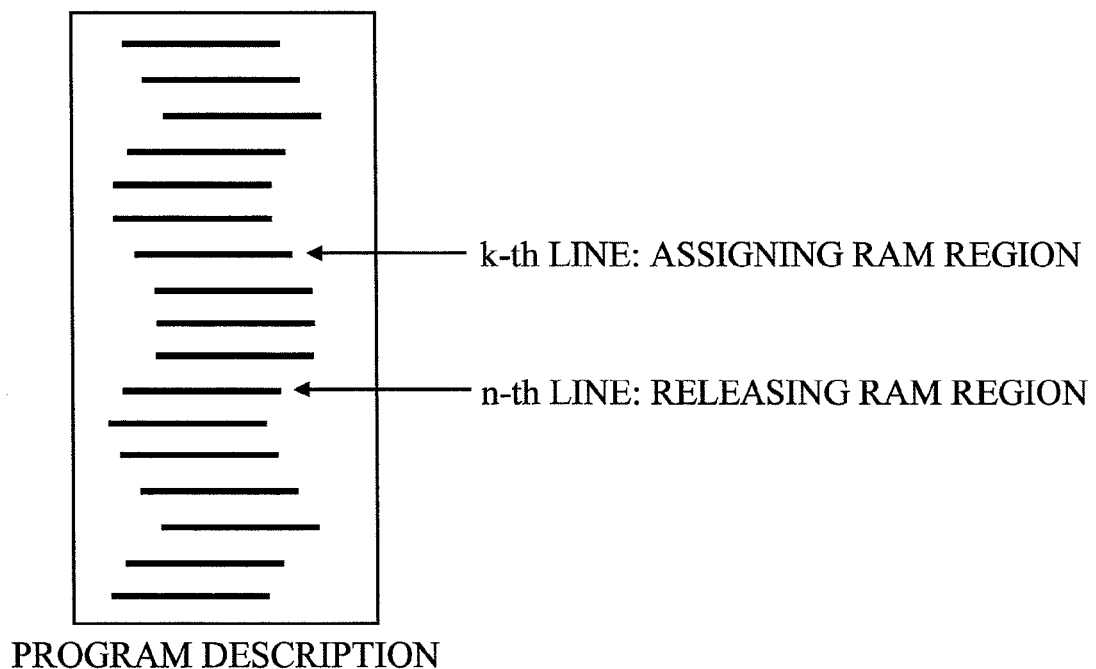
FIG. 4 is a diagram showing an operation example of the embodiment of FIG. 3.
Figure 5:
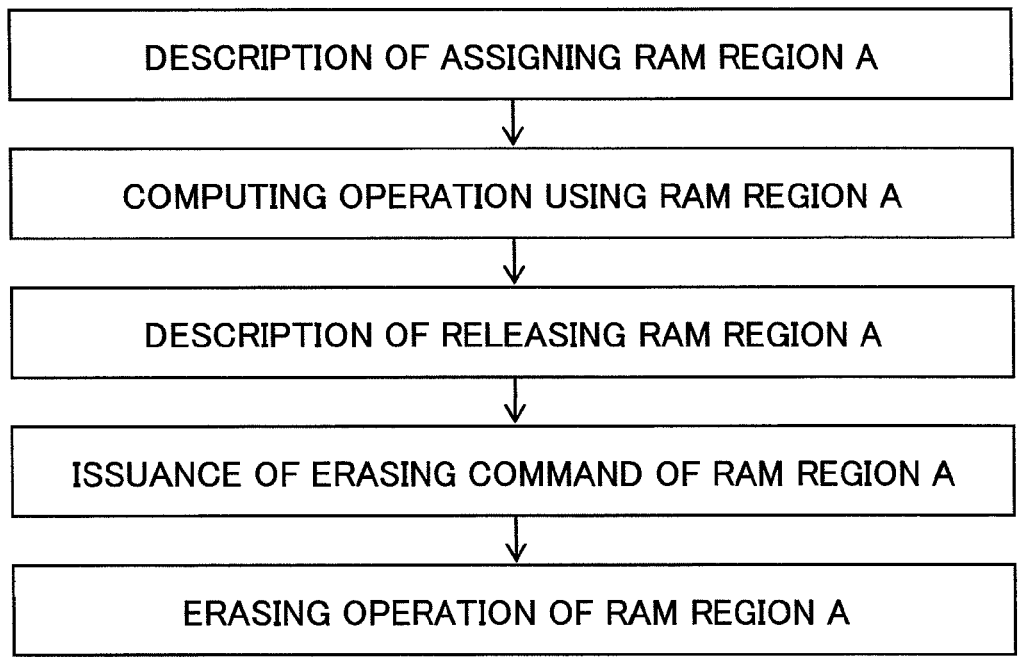
FIG. 5 is a diagram showing a flow of assigning, releasing and erasing operations of a RAM region in a program.

FIG. 4 shows an embodiment that describes one example of operations using the device of FIG. 3 based on a relationship between a program description and an erasing operation. FIG. 4 shows a state in which respective lines of the program description are arranged, and computing operations are successively carried out in accordance with the description by the CPU in the device shown in FIG. 3. In this case, the k-th line is supposed to be a command by which a region of the memory RAM to execute a predetermined process of the program is assigned. In accordance with this, a region having a memory space in the description serves as a work memory region of this process, and the corresponding process is carried out. After the process, the n-th line serves as a command for releasing this memory space. At this time, in the device shown in FIG. 3, the erasing operation of this region can be carried out at high speed with low power consumption by using the method exemplified in FIG. 1 or FIG. 2. More specifically, as shown in FIG. 5, a certain RAM region A is assigned, and after the computing operation using this has been completed, a description for releasing the RAM region A appears. As a result, the CPU issues a command for erasing this region. Consequently, the erasing operation for the corresponding region A is carried out by the SPRAM or SPRAM CHIP on the PROC corresponding to the region. In accordance with the present embodiment, an operation in which a region assigned in the middle of an execution of one program is carefully erased becomes possible, and a system superior in security can be configured.

Figure 6:
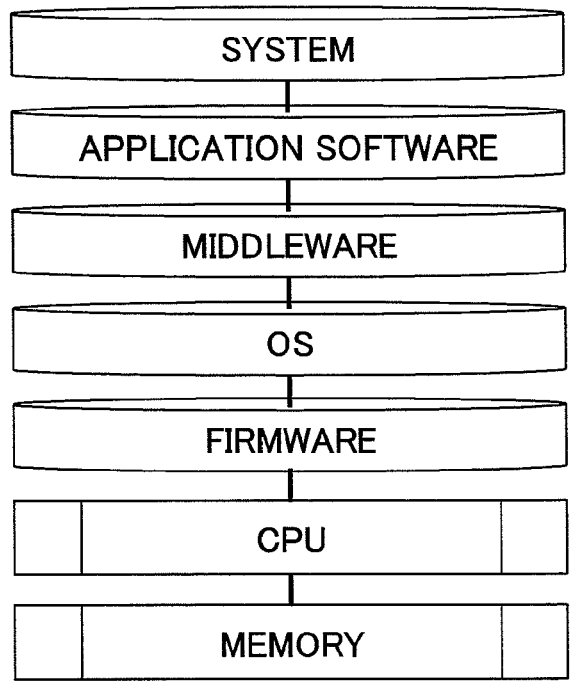
FIG. 6 is a diagram showing a schematic hierarchical structure of a system.
Figure 7A:
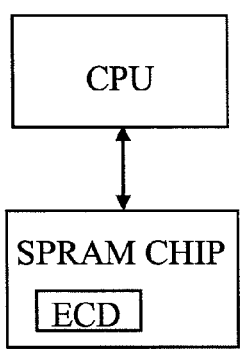
FIG. 7A and FIG. 7B are diagrams showing flows of assigning, releasing and erasing operations in the RAM region for respective applications in the system.
Figure 7B:
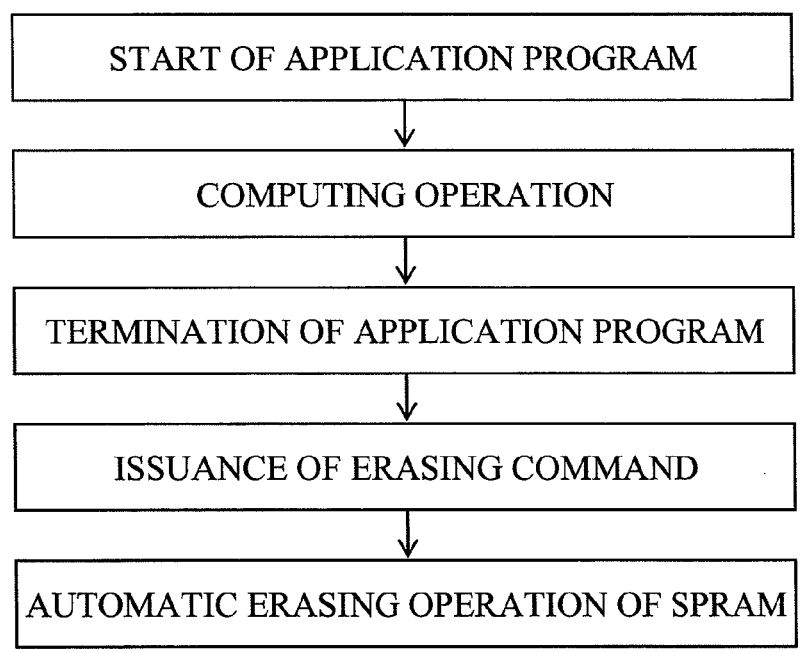

This erasing operation can be used in various levels of a hierarchy of computing operations. FIG. 6 schematically shows the hierarchical structure of the system for describing the embodiment. At the thought of a certain system, there are pieces of application software that are operated thereon. In order to operate the application software, middleware for efficiently coupling an OS which is basic software of the computing system and the application software needs to exist. Moreover, hardware for operating this OS is mainly composed of a CPU and a memory, and a device referred to as firmware is used in order to efficiently operate the hardware on the OS. In a system having such a hierarchy, the present invention is characterized in that a memory located on the lowermost level in FIG. 6 is a nonvolatile memory capable of being rewritten unlimited number of times, can achieve rewriting performances equivalent to those of the DRAM and SRAM, and is provided with an erasing mode, and further the memory can carry out the erasing operation at high speed with low power consumption. In such a hierarchy, various functions are available based on devises of the user, and a highly secure system can be constructed. This example will be described with reference to FIG. 7. In this example, for convenience of description, two devices shown in FIG. 7A, that is, a CPU and an SPRAM CHIP provided with the erasing control block ECD will be described. In this example, an application is operated by the CPU. FIG. 7B shows one example. First, an application program is started to carry out an operation, and this application program is then terminated. The operation up to this is a normal operation. Thereafter, a command for carrying out an erasing operation is issued in the present invention. Thus, the system using the present invention is characterized in that the region that has been used in this application is erased by the command. When the erasing command is issued, for example, the SPRAM CHIP erases all the chips by using the methods shown in FIG. 1 and FIG. 2. As a result, all the data acquired and created by the operations of this application become no longer readable, and it is possible to provide a system with high security.

Fourth Embodiment

Figure 8:
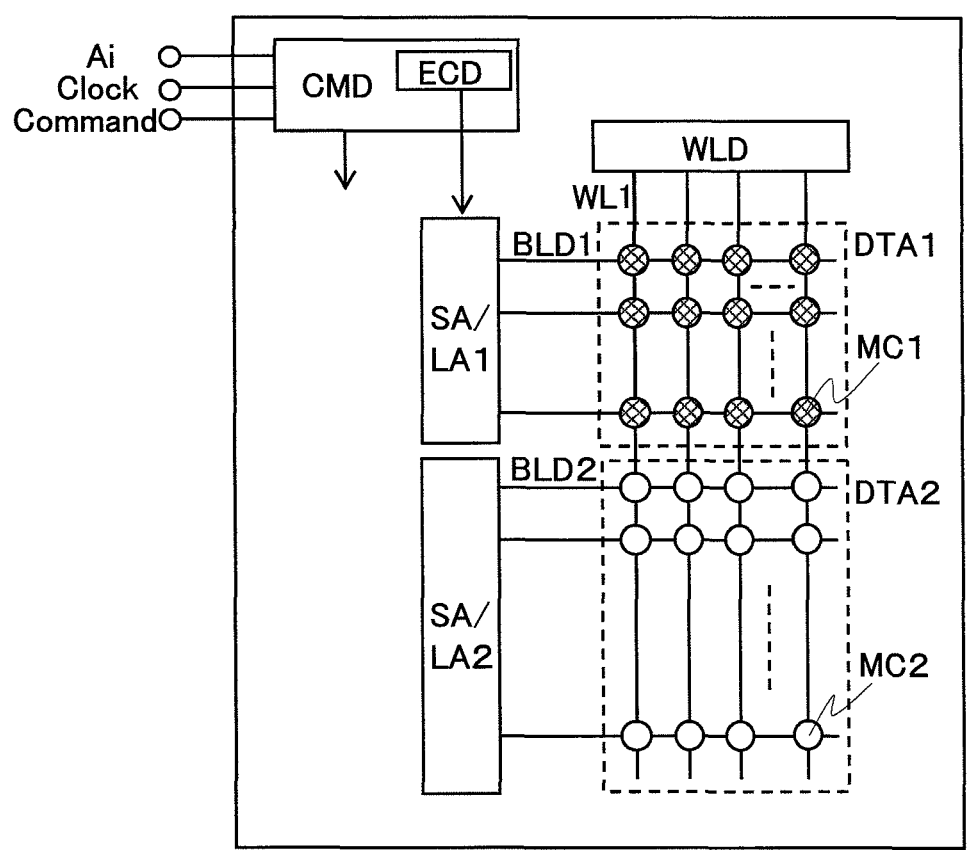
FIG. 8 is a diagram showing a fourth embodiment of the present invention.

FIG. 8 is a diagram showing a fourth embodiment of the present invention. In the present embodiment, data is divided into a plurality of parts and stored in the same manner as that of the first embodiment, but the present embodiment is characterized in that the structure of the memory cell array or the structure of the memory cell thereof is different from that of the aforementioned embodiment. Accordingly, the memory cell corresponding to a part to be erased can be designed with a higher degree of freedom. DTA1 and DTA2 are respectively memory cell arrays. In the DTA1, the memory cells MC1 are tightly arranged two-dimensionally over the region. BLD1 is an example of a bit line, and is composed of a sense amplifier and an SA/LA1 serving as a latch for writing data. In the DTA2, memory cells MC2 are provided and are connected to an SA/LA2 serving as a sense amplifier/latch through a bit line BLD2. Unit data to be written or read is divided and stored in these two arrays. Of course, the data may be divided into three or more parts. The present embodiment is characterized in that the DTA1 and the DTA2 have respectively different memory cells. For example, the DTA2 is an SPRAM, but the DTA1 may be an SRAM or a DRAM. In accordance with this system, although data remains in the DTA2 when the power supply is shut off, the data in the DTA1 is erased. Therefore, if the user reads out only the data of the DTA1 and retains the data in another storage device, the original data cannot be restored by anyone other than the user who has the data of the DTA1. In this case, the user does not have to store all the data in another storage device, but it is only necessary to separately store only a part of the data in an external storage device with a small capacity. As a result, when the power supply is once shut off, no other persons can read the data, while saving the necessary data, and it is possible to achieve high degree of security. In particular, in comparison with the first embodiment, when the power is shut off before an issuance of an erasing command, there is a possibility that the data might remain also in the COA in the first embodiment. In the configuration of the present embodiment, however, since the information is lost when the power supply is shut off, it is possible to achieve high degree of security.

Alternatively, the configuration in which memories having different erasing rates are used or in which only one of memories is provided with an erasing function is also available. For example, as the memory cell of the DAT1, a cell having the TMR element whose area is smaller than that of the memory cell of the DTA2 is used. In this manner, the erasing process can be carried out more easily, or the setting in which the data of the DTA2 is made nonvolatile for 10 years and the data of the memory cell of the DTA1 is lost only in one year can be made by appropriately selecting the area. An embodiment that uses an auxiliary erasing function will be discussed later. Moreover, FIG. 8 shows the example in which the SA/LA1 is controlled by the erasing control circuit ECD, but the SA/LA2 is not controlled thereby. In other words, only the SA/LA1 circuit can carry out an erasing operation. In FIG. 8, the other reference signs are the same as those of FIG. 1.

Moreover, the DTA1 of the present embodiment can be applied to the COA of the second embodiment. For example, by employing the structure in which information "0" indicating the erasure of the information of the DTA1 at the time of application of the power supply is stored therein, information is always read from the DPD immediately after the re-application of the power supply, and it is possible to ensure high degree of security.

Fifth Embodiment

Figure 9:
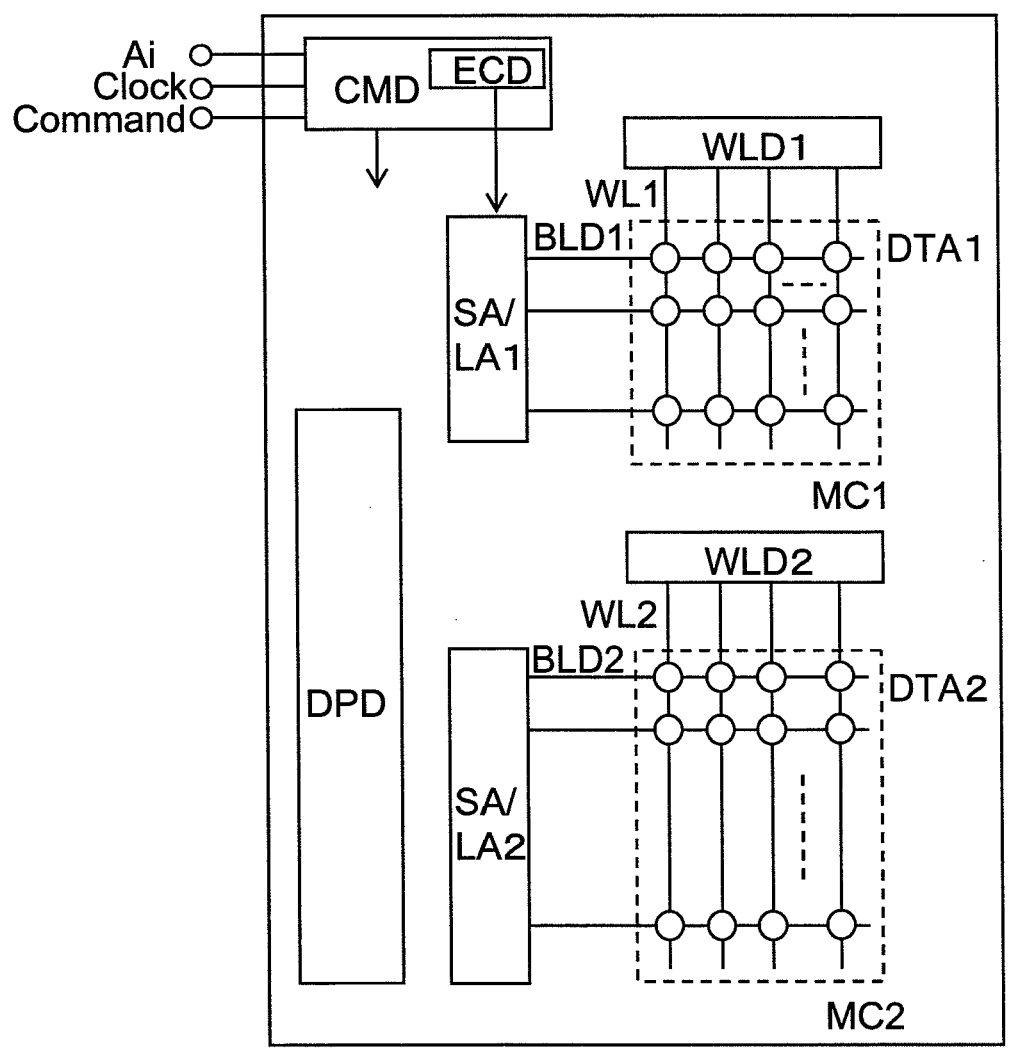
FIG. 9 is a diagram showing a fifth embodiment of the present invention.

FIG. 9 is a diagram showing a fifth embodiment of the present invention. In this embodiment, DTA1 and DTA2 described in the fourth embodiment are disposed at different places on a chip and are respectively provided with word drivers WLD1 and WLD2. The unit of data writing or the unit of data reading is disposed in these two arrays in a divided manner, and a plurality of DTA1 are collected and disposed in one place of the chip, and the DTA2 is disposed on the rest of the chip portion. This embodiment is characterized in that physical identification of the relationship between data divided into the two arrays is difficult, and thus security against invalid data analyses can be further enhanced. Moreover, since the functions of the two arrays are different from each other, the chip with a smaller area can be formed by respectively collecting them to each one portion. In FIG. 9, for example, a DPD serving as a circuit which determines that the unit of data of the DTA1 whose information has been erased is defined as erased data and outputs desired predetermined data may be further installed.

Sixth Embodiment

Figure 10:
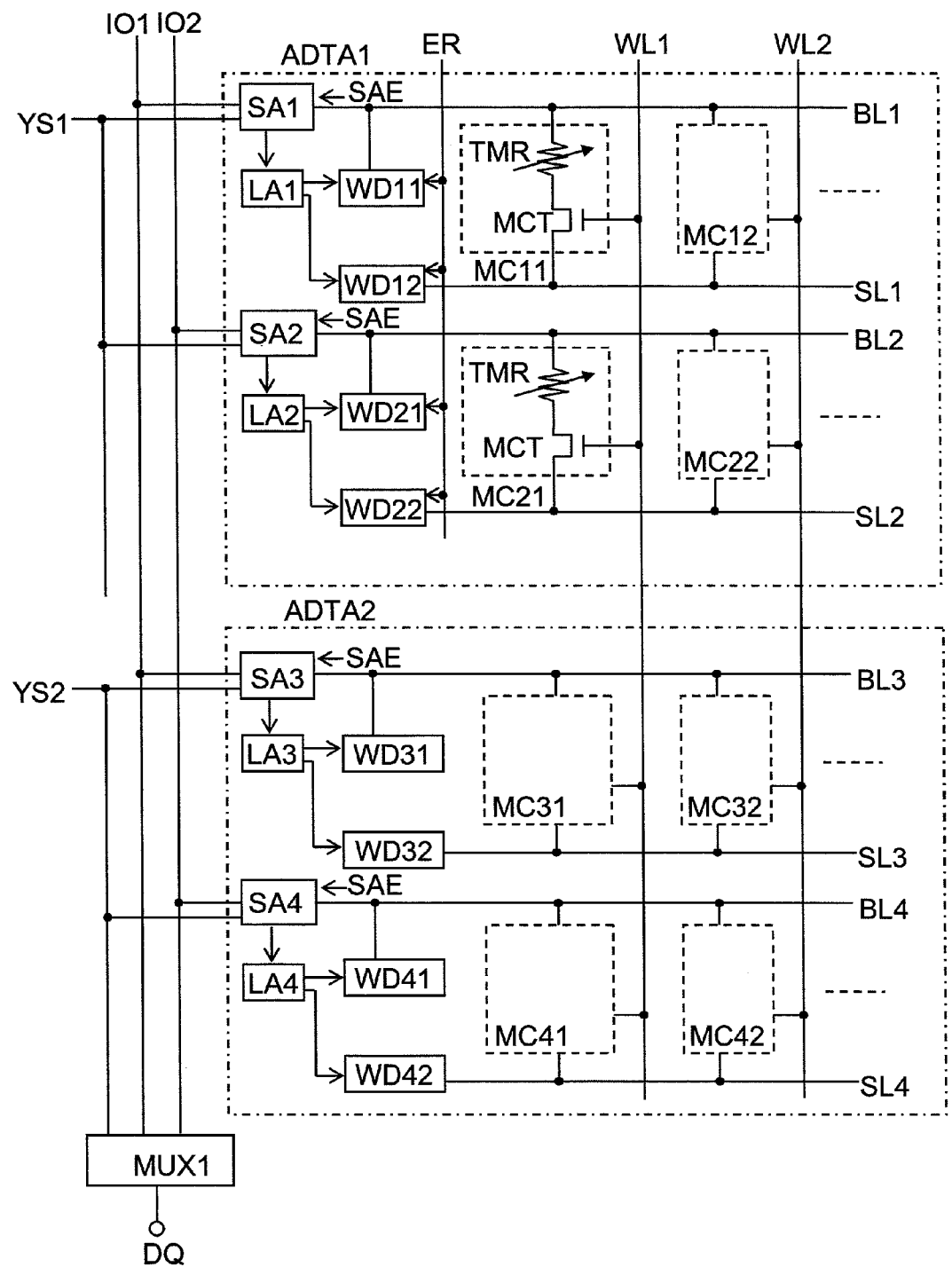
FIG. 10 is a diagram showing a sixth embodiment of the present invention.

FIG. 10 is a diagram showing a sixth embodiment of the present invention, and it illustrates a structural example including two array blocks ADTA1 and ADTA2 that store data in a divided manner and an input/output terminal DQ. In this case, ADTA1 corresponds to the COA of the first and second embodiments and also corresponds to the DTA1 of the fourth and fifth embodiments. Moreover, ADTA2 corresponds to the DTA of the first and second embodiments and also corresponds to the DTA2 of the fourth and fifth embodiments. MC11 and MC12 to MC42 connected to corresponding bit lines BL1 to BL4 and to source lines SL1 to SL4 are memory cells, and as shown by the MC11, each cell is composed of a TMR element TMR and a selection transistor MCT. The selection transistor of each memory cell is driven by word lines WL1 and WL2. SA1 to SA4 are sense amplifiers, LA1 to LA4 are latch circuits for storing the sense results of the sense amplifiers, and WD11-WD12 to WD41-WD42 are rewriting drivers. When the corresponding memory cell becomes a writing subject, the latch circuit LA outputs information in accordance with stored data. Thus, a complementary signal is formed by the rewriting driver WD, and an electric potential difference is generated in the bit line and the source line, so that a current flows to the memory cell. On the other hand, when the memory cell is not a writing subject, the complementary signal is output to the output line connected to the bit line side and the output line connected to the source line side. Therefore, in the case when the memory cell is not a writing subject, the bit line and the source line are driven to have the same electric potential and no electric potential difference is generated therebetween, and no current flows to the memory cell. Consequently, no writing operation is carried out. SAE denotes an activating signal of the sense amplifier. The sense amplifier of the ADTA1 is selected by a YS signal YS1, and the sense amplifier of the ADTA2 is selected by a YS signal YS2. In the configuration of this embodiment, the results of the sense amplifiers are transmitted to the two inner input/output lines IO1 and IO2 from the respective memory cell arrays ADTA1 and ADTA2. The connections between these IO1 and IO2 and the memory cell arrays ADTA1 and ADTA2 are made by the YS1 and YS2. In addition, actually, more number of memory cell arrays are disposed and word lines and YS signals corresponding to these are prepared. One of the inner input/output lines IO1 and IO2 is selected by a multiplexer MUX1, and the signal thereof is output to the input/output terminal DQ. The data input from the outside is carried out in the same manner, and signals from the DQ are assigned to the respective IO1 and IO2 in the MUX1 and the signal is transmitted to the array to be written in by the YS signal.

By using the array structure described above, the present invention can be provided as a memory array. In the present embodiment, the ADTA1 and ADTA2 are different from each other in that the erasing control signal ER is input to the rewriting driver in the ADTA1, but it is not input to the rewriting driver in the ADTA2. More specifically, the erasing operation is carried out only in the ADTA1. Although a specific example will be described with reference to FIG. 11, the present embodiment is characterized in that since the structure provided with two arrays is used, one unit data is divided into two parts and stored therein, and erasing means is disposed only in one of the arrays as described above, this memory chip can have a mode for carrying out an erasing operation, and the erasing operation can be carried out at high speed with low power consumption.

Figure 11A:
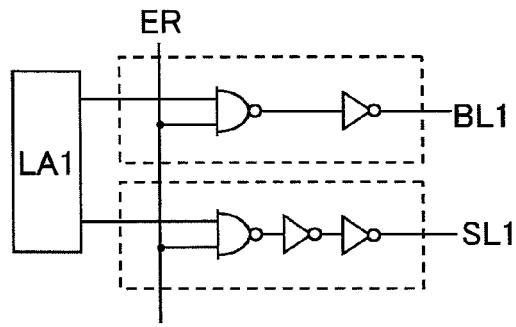
FIG. 11A and FIG. 11B are diagrams showing examples of rewriting drivers.
Figure 11B:
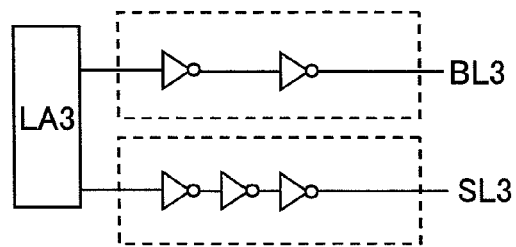

FIG. 11 shows a brief example of the different rewriting drivers of the ADTA1 and ADTA2 as an embodiment. First, in the ADTA2 which does not carry out the erasing operation, as shown in FIG. 11B, the bit line BL3 and the source line SL3 may be driven by directly using an output of the latch with a sufficient driving force added thereto. Although not shown in this diagram, if it is necessary to input a signal for determining the timing, one of the inverters may be changed to a 2-input NAND. Next, in the ADTA1 which carries out an erasing operation, as shown in FIG. 11A, a 2-input NAND is simply prepared and the erasing control signal ER is input thereto. When the erasing control signal ER is set to a low level, the output of all the 2-input NAND is set to a high level. It is to be noted that the erasing control signal ER is commonly input to all the rewriting drivers of the ADTA1. Therefore, the same information is written to all the cells. In this manner, the information in these memory cells can be erased, and the restoration thereof becomes impossible even when the ADTA1 is read in combination with the ADTA2. Moreover, even when the information is to be read out, meaningless information from different circuits is given instead of the information of the arrays. Note that, if it is necessary to input a signal for determining the timing, one of the other inverters may be changed to a 2-input NAND.

Figure 12:
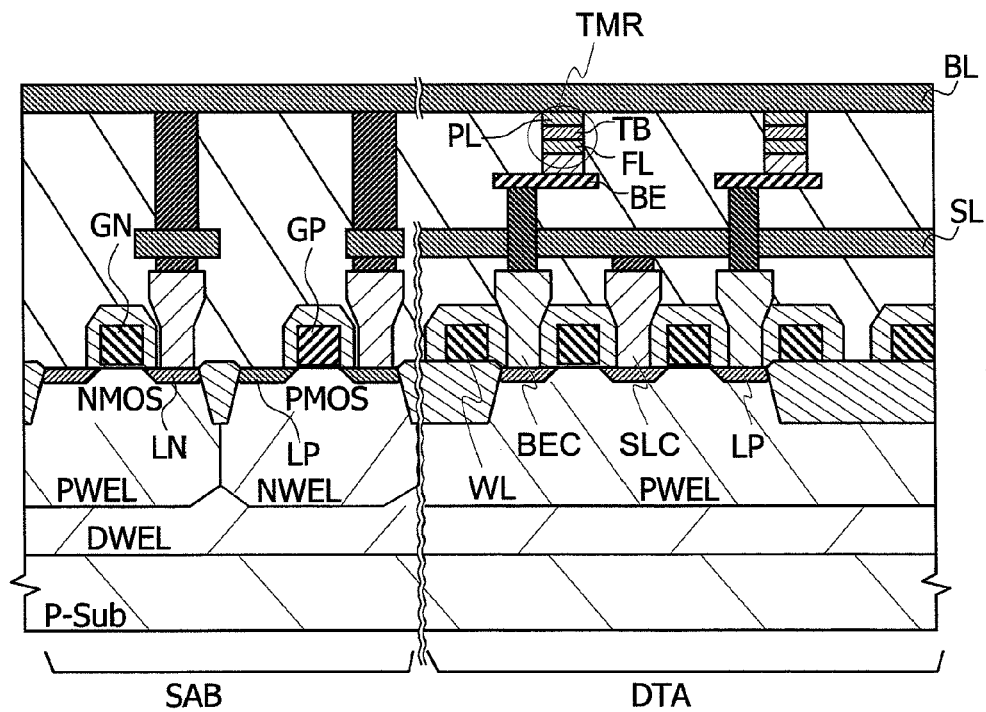
FIG. 12 is a diagram showing a cross-sectional view of a memory of a part of a memory cell array and a cross-sectional view of a peripheral circuit thereof.

FIG. 12 is a diagram showing a cross-sectional view of a memory of a part of a normal memory cell array in which the operation of the erasing command of the present invention is not carried out and a cross-sectional view of a peripheral circuit thereof. In the case when specific information is written by the erasing command like in the case of the first embodiment and others, the same structure may be used. The memory cell is composed of one nMOS transistor and one tunnel magnetoresistive element TMR. The word line WL is connected to a gate GP of the transistor. As the gate material, p-type polysilicon or p-type polysilicon having silicide or tungsten (W) stacked thereon is used to reduce the resistance. The memory cell transistor is formed in a p-type semiconductor region pWEL. The p-type semiconductor region pWEL is formed in an n-type semiconductor region DWEL, and this DWEL is formed on a P-Sub. A source-line contact SLC is disposed on one of diffusion layers LN of the nMOS transistor. The source line contact is commonly used with the adjacent memory cell MC so as to reduce the area thereof. On the source line contact, a source line is placed in a direction orthogonal to the word line. On the diffusion layer LP with no source contact disposed thereon, a lower electrode contact BEC connected to the tunnel magnetoresistive element TMR is disposed. The lower electrode contact BEC is connected to the lower electrode BE on which the tunnel magnetoresistive element is disposed. On the lower electrode BE, the tunnel magnetoresistive element TMR composed of a plurality of magnetic material films and tunnel films is disposed. The tunnel magnetoresistive element TMR includes at least one layer of a tunnel film TB and a pinned layer PL and a free layer FL placed on the both sides thereof. In the pinned layer PL of the magnetic material, the spin direction of the inner electrons is fixed to a predetermined direction. On the other hand, in the free layer FL of the magnetic material, the spin direction of the inner electrons is set to either one of the two states, that is, parallel and anti-parallel states relative to the pinned layer. In the present structure, the pinned layer PL is disposed between the tunnel film TB and the lower electrode, and the free layer FL is disposed between the bit line BL wired on the upper layer of the tunnel magnetoresistive element TMR and the tunnel film TB. The bit line is placed so as to be orthogonal to the word line and parallel to the source line.

Figure 13:
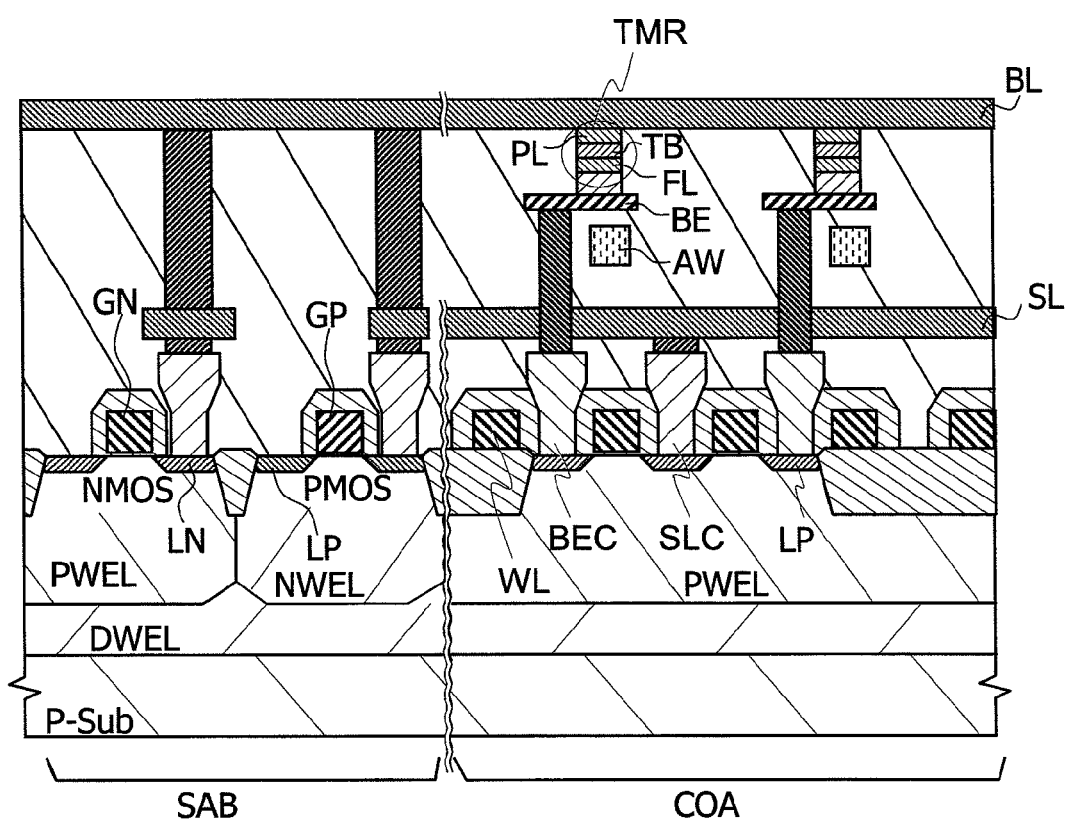
FIG. 13 is a diagram showing a cross-sectional view of a memory of a part of a memory cell array and another cross-sectional view of a peripheral circuit thereof.

FIG. 13 is a diagram showing a cross-sectional view of a memory of a part of a memory cell array in which the operation by the erasing command of the present invention is carried out and a cross-sectional view of a peripheral circuit thereof. The present embodiment is characterized in that an assist word line AW extending in parallel with the word line is disposed below the lower electrode BE. A magnetic field can be generated by applying an electric current through this assist word line AW. This magnetic field can accelerate the writing in a specific direction, that is, accelerate an erasing operation. Although the case in which it is orthogonal to the bit line is shown in this diagram, it can be disposed in parallel to the bit line. Further, it is also possible to align directions of all the free layers of the memory cells connected to one bit line to the same direction by using this generated magnetic field. That is, the erasing operation can be easily realized.

Figure 14:
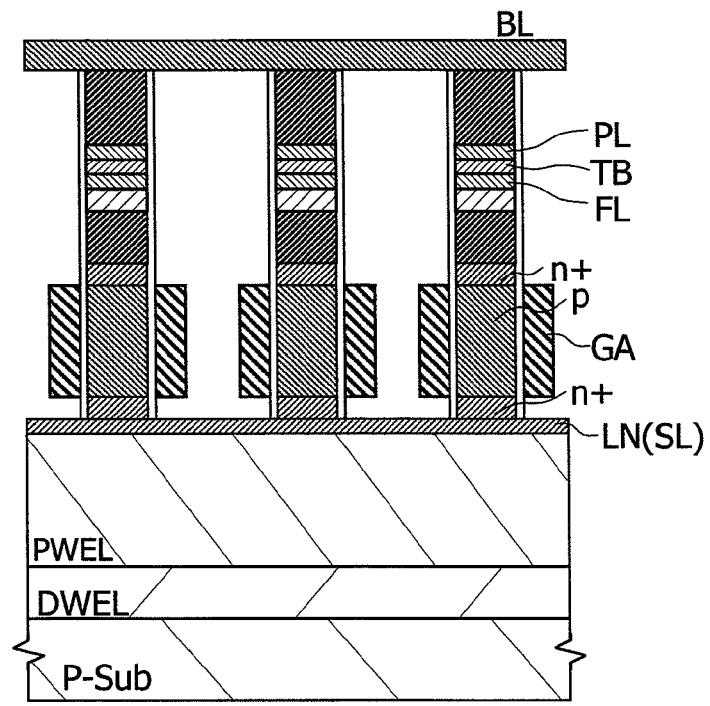
FIG. 14 is a diagram showing an example of a cross-sectional structure of another memory of the memory cell array.

FIG. 14 is a diagram showing a cross-sectional structure of another memory of a normal memory cell array in which the operation by the erasing command of the present invention is not carried out. Its memory cell transistor is composed of a vertical MOS and the memory cell area can be reduced to $4F^2$. PL denotes a pinned layer, FL denotes a free layer, and TB denotes a tunnel barrier, and they form a TMR element. Although the PL is located on an upper part in this diagram, the PL may be placed below the FL. Moreover, the order of the layouts in the height direction relative to the vertical MOS may be made different from that shown in this diagram. GA denotes a gate and upper and lower $n^+$ regions serve as a source and a drain, and the same operation as that of a normal MOS is carried out by a voltage applied to the gate GA of the p region. The gate GA encloses the p region annularly in some cases or controls the surfaces of the vertical structure from two directions or three directions in other cases. Although an nMOS is shown as the vertical MOS in this diagram, a pMOS may also be used.

Figure 15:
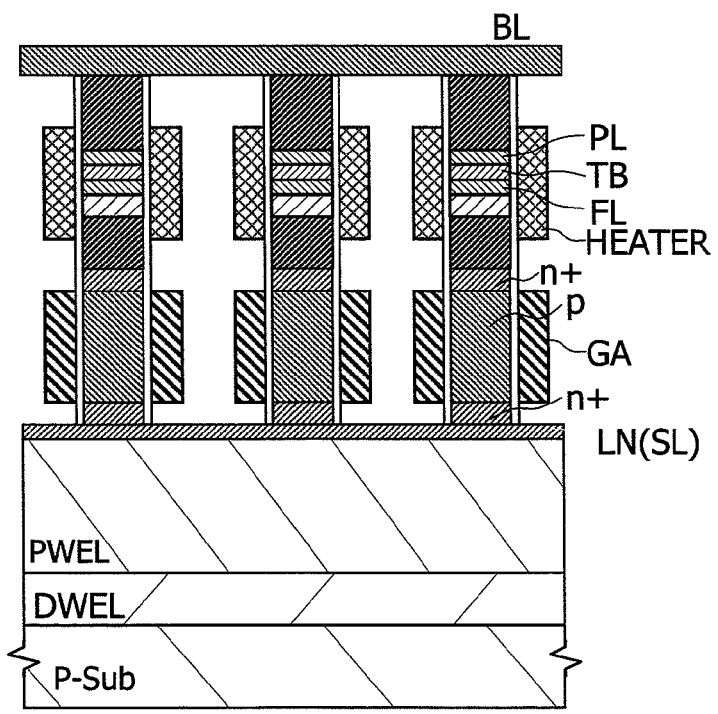
FIG. 15 is a diagram showing an example of a cross-sectional structure of another memory of the memory cell array.

FIG. 15 is a diagram showing another example of a cross-sectional structure of a memory of a part of a memory cell array in which the operation of the erasing command of the present invention is carried out. In this structure, a heat generating element HEATER is added to a TMR element unit. This part has a characteristic of generating heat when a current or a voltage is applied thereto, and at the time of writing, this element is activated to heat the TMR element. In the case of high temperature, an electric current required for rewriting can be reduced. For this reason, this structure is characterized in that a rewriting operation, that is, an erasing operation can be carried out at high speed with low power consumption. When a writing operation using spin injection is carried out by selecting a word line, a bit line and a source line, a signal is applied to the HEATER so as to generate heat. Alternatively, the state of the free layer of the memory cell can be made random by applying a signal only to the HEATER, and the erasing operation can be carried out also in this manner.

Figure 16:
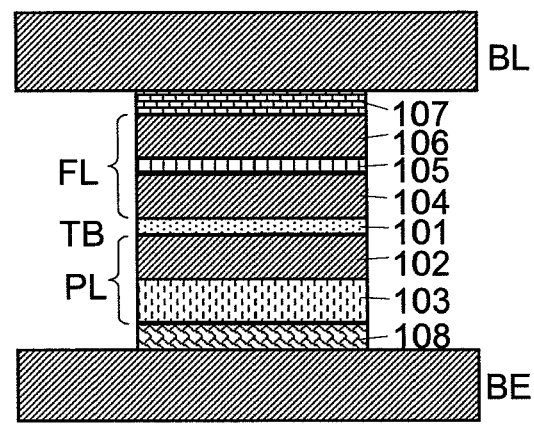
FIG. 16 is a diagram showing an embodiment of a part of a TMR element.
Figure 22A:
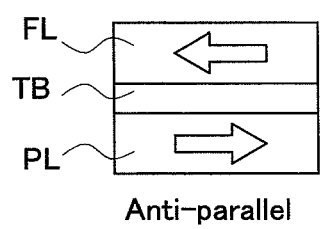
FIG. 22A and FIG. 22B are diagrams showing states of a TMR element.
Figure 22B:
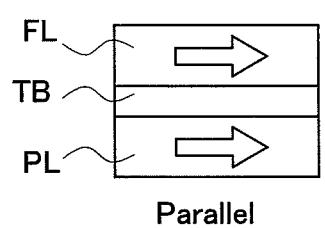

FIG. 16 shows an embodiment of a part of the TMR element. As described in the conventional example of FIG. 22, the tunnel magnetoresistive element TMR has at least two magnetic layers, one of which is a pinned layer PL in which the spin direction is fixed and the other of which is a free layer FL in which the spin direction takes two states, that is, an anti-parallel state of FIG. 22A and a parallel state of FIG. 22B relative to the pinned layer. The tunnel barrier film TB is interposed between these films. FIG. 16 shows an example that illustrates this structure in more detail. The metal wiring BE and the bit line BL correspond to those of FIG. 12. Also in this diagram, a pinned layer PL, a free layer FL, and a tunnel barrier film TB are provided. First, a metal layer 108 is placed on the metal wiring BE. The pinned layer PL is disposed thereon, and the layer PL has a two-layer structure of 103 and 102 in this diagram. Here, 103 denotes an anti-ferromagnetic film, and 102 denotes a ferromagnetic film. By combining the anti-ferromagnetic film 103 with the ferromagnetic film 102 in this manner, the direction of the magnetization initially determined is firmly secured. In this manner, a pinned layer PL whose magnetization is not changed by a rewriting current or the like is obtained. On this layer, the tunnel barrier film TB is placed, and the free layer FL is placed thereon. The tunnel barrier film TB is an insulating film made of MgO or the like. In this example, the free layer FL has a multi-layer structure of 104, 105 and 106. The films 104 and 106 are ferromagnetic films, while the film 105 is a metal film made of Ru (ruthenium) or the like. Moreover, magnetizations of the films 104 and 106 are made anti-parallel to each other, and a structure in which a metal layer is sandwiched by two ferromagnetic films is exemplified here. However, the structure in which the number of ferromagnetic films is increased to use four ferromagnetic films and metal layers (three layers are required in total in this case) are interpolated among these may also be adopted. The multi-layer structure may have more layers. By using this structure, it becomes possible to increase tolerance to fluctuations in the direction of magnetization in the free layer FL due to heat disturbances. In general, when the temperature increases, the direction of magnetization in the free layer FL tends to be easily fluctuated due to heat, and there is a higher possibility of rotation in a direction reverse to the written direction. However, by using such a multi-layer structure, the possibility of rotation in the reverse direction can be suppressed to a level that causes no problem in practical use. Moreover, a threshold value of an electric current to be used for rewriting can be suppressed to a low level. The upper part of the free layer FL is connected to the bit line BL through the metal layer 107. When the TMR element of this example is used in the present invention to carry out a rewriting operation at the time of reading, a stable reading can be carried out with a comparatively large current.

Figure 17A:
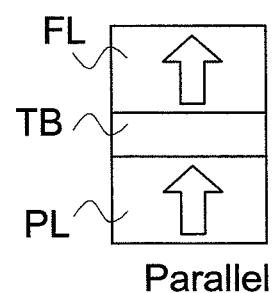
FIG. 17A and FIG. 17B are schematic diagrams showing a part of another TMR element.
Figure 17B:
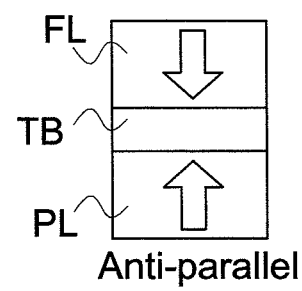

FIG. 17 is a diagram schematically showing a part of a TMR element of another memory cell array which can achieve the present invention. In the present embodiment, the direction of magnetization of the free layer and the pinned layer is not horizontal to, but perpendicular to the tunnel barrier layer. By selecting such materials, it is possible to provide a memory element in which two states (parallel and anti-parallel) of the TMR element are stable against the disturbance due to heat. The embodiments in which a system of the present invention to carry out a temperature controlling and a destructive reading is applied to this structure are characterized in that even when the scaling develops, a memory operation that is carried out stably in a wide temperature range can be achieved. By using various memory cells to which the TMR element having such a structure is applied, an operation in which a rewriting signal having a reverse characteristic to an original rewriting signal is applied prior to the original rewriting signal, which is a feature of the present invention, can be achieved.

Seventh Embodiment

Figure 18:
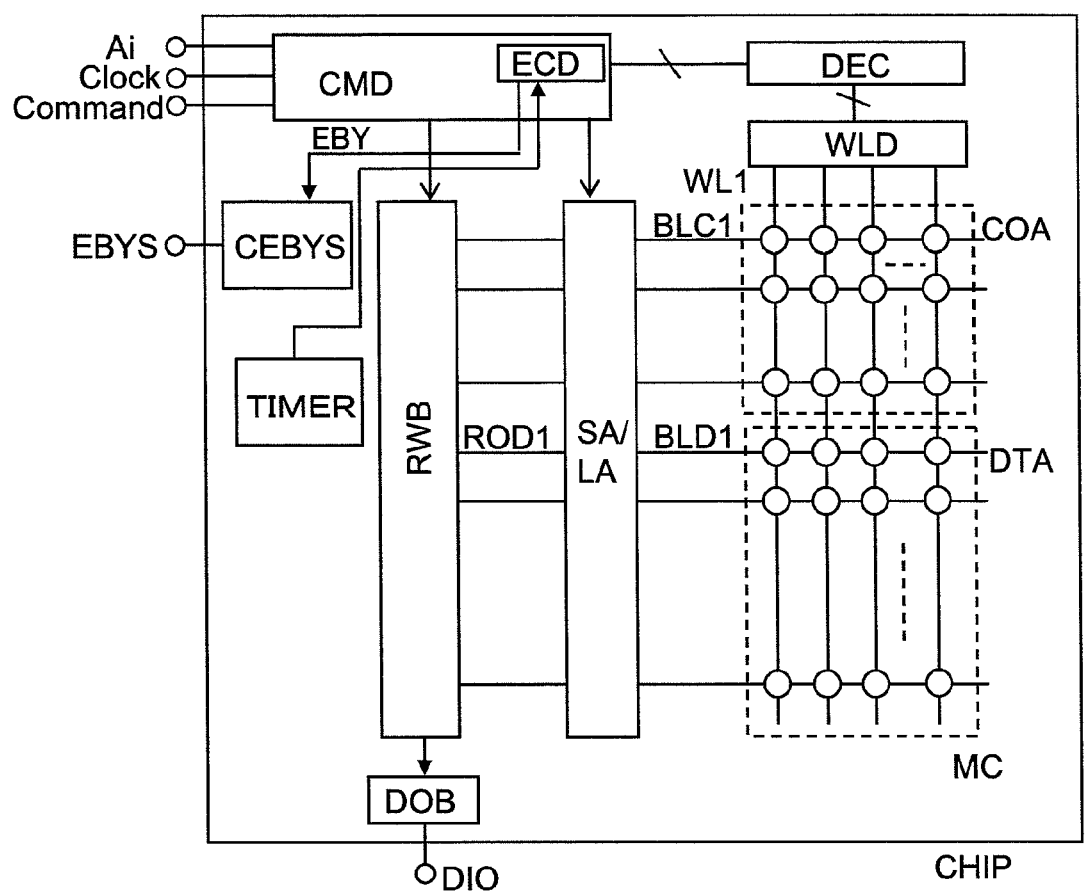
FIG. 18 is a diagram showing a seventh embodiment of the present invention.

FIG. 18 shows a seventh embodiment of the present invention. The signals and parts that are the same as those of FIG. 1 are denoted by the same reference signs, and they are applicable to any of the first to sixth embodiments. The present embodiment is characterized in that an external terminal ESYS that gives a signal indicating that the chip is being subjected to an erasing operation or a signal indicating that an erasing operation has been completed is provided. A busy signal EBY serving as a signal indicating the erasing state is given by the ECD that carries out an erasing control, and the state that an erasing operation is being carried out or that the erasing operation has been completed is transmitted. The signal EBY is output from the external terminal EBYS by a buffer circuit CEBYS. In this manner, the system can obtain a completion signal of the erasing operation of the corresponding chip. The erasing operation itself is carried out in the manner described in the aforementioned embodiments. Depending on the systems, the completion signal of the erasing operation is sometimes required, and the present embodiment is characterized by being capable of supplying the signal. Moreover, in FIG. 18, a timer circuit TIMER is installed together with the external terminal EBYS and its related circuits. Consequently, for example, when five minutes have elapsed without resetting the TIMER, the TIMER sends a signal for carrying out the erasing control to the ECD, thereby starting the erasing operation. As a result, the present embodiment is characterized in that the chip is not allowed to possess data over a predetermined period of time.

Eighth Embodiment

Figure 19:
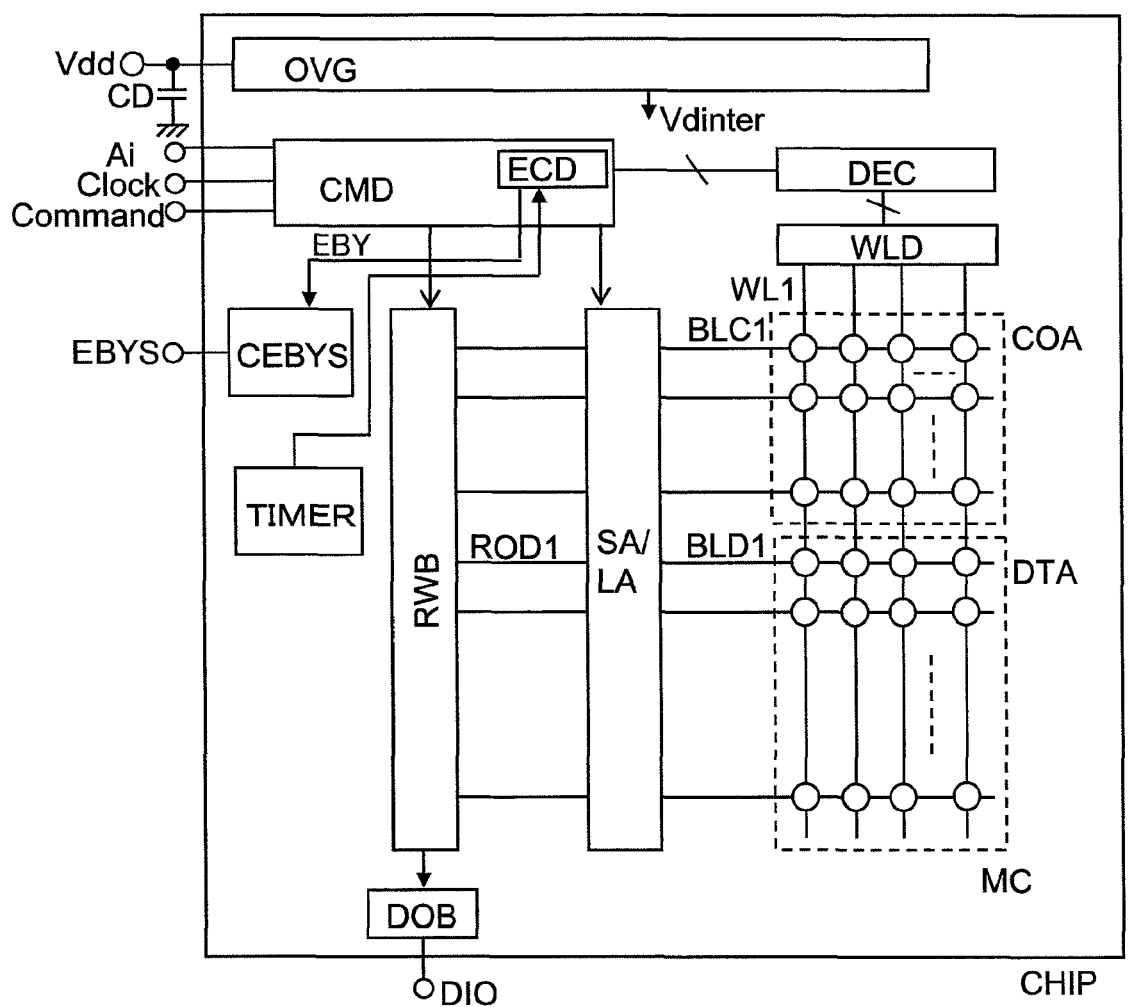
FIG. 19 is a diagram showing an eighth embodiment of the present invention.

FIG. 19 shows an eighth embodiment of the present invention. The signals and parts that are the same as those of FIG. 18 are denoted by the same reference signs. In the present embodiment, for example, Vdinter is shown as an example of an inner power supply of an inner power supply generation circuit OVG, and an external power supply terminal is Vdd. In addition, although not shown in the aforementioned embodiments, the inner power supply generation circuit like this may be sometimes installed therein. The present invention is characterized in that a large capacitor element CD is attached to the external power supply terminal Vdd. This may be attached to the outside of the chip, may be sealed in the package together with the chip, or may be formed on the chip. The present embodiment is characterized in that even if the power supply is suddenly shut off, an erasing operation is carried out by using a charge stored in this capacitor element CD. In the present embodiment, since the erasing operation can be carried out at low power, even the charge stored in the capacitor element CD can carry out the erasing operation.

Figure 20A:
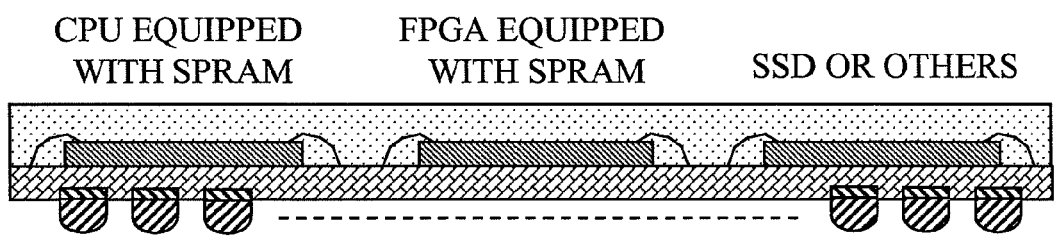
FIG. 20A and FIG. 20B are diagrams showing examples of applications of an MCM (Multi Chip Module)
Figure 20B:
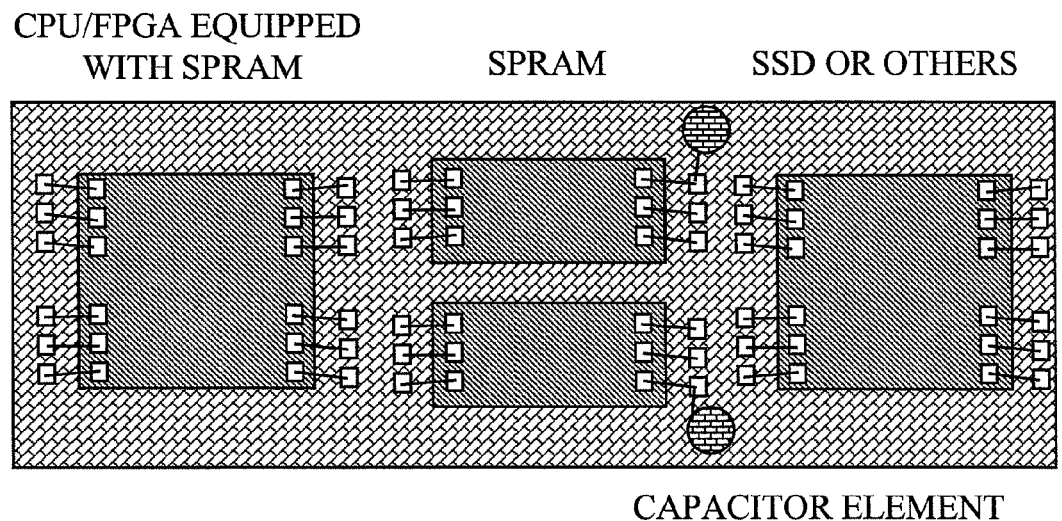
Figure 21A:
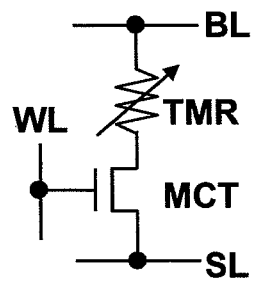
FIG. 21A and FIG. 21B are diagrams showing a conventional example.
Figure 21B:
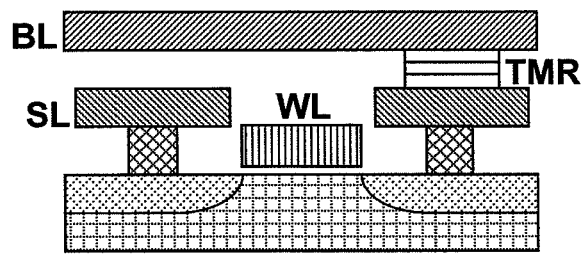

As shown in FIG. 20, the semiconductor device of the present invention may be formed into an MCM (Multi-Chip Module) so as to dispose the capacitor element therein. FIG. 20A is a front view and FIG. 20B is a plan view thereof. The semiconductor device is formed by mounting a CPU chip provided with an SPRAM having an erasing mode, an SPRAM single chip with an erasing mode, and a storage element SSD constituted by solid-state elements such as a NAND flash on a high-density mounting board. An RF chip or the like may be mounted thereon in some cases. In this way, the functions desired by the user can be realized with high performances and in a shorter period of time than the case of assembling it into a single chip. Moreover, the device supports the erasing operation, the speed as high as the SRAM/DRAM is achieved, and it is nonvolatile. Also, software errors do not occur therein.

INDUSTRIAL APPLICABILITY

The present invention relates to a semiconductor storage device, and also to a field of an assembled memory or a single memory capable of carrying out an erasing operation at high speed with low power consumption in a nonvolatile memory which can be rewritten many times and has a small area.

REFERENCE NUMERALS

Ai: address signal; Clock: clock signal; Command: command signal; CMD: command control circuit; ECD: erasing operation control circuit; DEC: decoder circuit; WLD: word driver; RWB: input/output control circuit; COA, DTA, ADTA: memory cell array; MC: memory cell; DOB: input/output buffer; DIO, DQ: input/output terminal; DRW: output of RWB; BLC, BLD, BL: bit line; WL: word line; CHIP: chip; DPD: dummy pattern data block; SELK: selection circuit; AA: logical circuit unit; MEM IO: memory-dedicated control and input/output circuit; ORAM: memory; MCT: selection transistor; TMR: magnetic element that takes a different resistance value depending on stored information; SL: source line; WD: rewriting driver; SA: sense amplifier; LA: rewriting latch; SAE: sense amplifier control signal; YS: YS signal; IO: IO line; MUX: multiplexer; ER: erasing control signal; SLC: source line contact; BEC: lower electrode contact; BE: lower electrode; GP: p-type polysilicon gate; LP: p-type diffusion layer; FL: free layer; TB: tunnel film; PL: pinned layer; GN: n-type polysilicon gate; LN: n-type diffusion layer; PWEL: p-type semiconductor region; NWEL, DWELL: n-type semiconductor region; P-Sub: p-type substrate; STI: element separation region; AW: assist word line; GA: gate; HEATER: heat generating element; EBY: busy signal; EBYS: external terminal; CEBYS: buffer circuit; TIMER: timer circuit; OVG: inner power supply generation circuit; Vdd: external power supply terminal; CD: capacitor element.

The invention claimed is:
1. A semiconductor storage device comprising:
a memory cell array having a plurality of word lines, a plurality of bit lines which intersect with the plurality of word lines, and a plurality of memory cells disposed at predetermined intersections between the plurality of word lines and the plurality of bit lines; and
a command control circuit which controls writing and reading operations to and from the memory cell array, wherein each of the plurality of memory cells includes:
a tunnel magnetoresistive element having a tunnel film, a pinned layer which is placed adjacent to the tunnel film and whose electron spin direction is fixed to a predetermined direction, and a free layer which is placed adjacent to a surface of the tunnel film which is opposed to the surface adjacent to the pinned layer and whose electron spin direction is set either in parallel with or in anti-parallel with the pinned layer; and
a MOSFET whose gate is connected to the word line and whose drain is connected to the pinned layer side of the tunnel magnetoresistive element, and
wherein when the command control circuit receives a writing command containing an address signal which indicates to which memory cells among the plurality of memory cells a writing operation is to be carried out, the command control circuit writes a series of data, which serves as one unit and is externally input, to the memory cells indicated by the address signal, and
the series of data written in accordance with the writing command is brought into an erased state by writing predetermined data to only a part of memory cells to which the series of data has been written, such that when a reading operation is then carried out only meaningless data rows are read, whereby high security can be achieved.

2. The semiconductor storage device according to claim 1, further comprising:
an erasing operation control circuit which controls an erasing operation to be carried out to the memory cell array,
wherein when the erasing operation control circuit receives an erasing command containing an address signal indicating which memory cells among the plurality of memory cells are to be erased, the erasing operation control circuit writes the predetermined data in accordance with the erasing command to a part of the memory cells among the memory cells in which the series of data has been written, and
wherein the number of memory cells to which the predetermined data is written when the erasing command is received is smaller than the number of memory cells to which the series of data is written when the writing command is received.

3. The semiconductor storage device according to claim 2, wherein the memory cell array further comprises: a plurality of source lines, each of which forms a pair with a corresponding one of the plurality of bit lines,
wherein the tunnel magnetoresistive element and the MOSFET contained in each of the plurality of memory cells are connected in series between the corresponding one of the plurality of bit lines and the corresponding one of the plurality of source lines,
wherein memory cells to which the series of data is written in accordance with the writing command are connected to the same word line of the plurality of word lines, and
wherein when the erasing command is input, the bit line and the source line connected to the memory cells to which the predetermined data is written are driven so as to have a predetermined voltage difference in accordance with the predetermined data, and the bit line and the source line connected to the memory cells to which the predetermined data is not written are driven to have the same electric potential.

4. The semiconductor storage device according to claim 3, wherein the memory cell array further comprises: a plurality of rewriting drivers connected to the plurality of bit lines and the plurality of source lines, and wherein the erasing operation control circuit outputs an erasing control signal only to the rewriting driver corresponding to the memory cells to which the predetermined data is written, among the plurality of rewriting drivers.

5. The semiconductor storage device according to claim 1, wherein the series of data to be written in accordance with the writing command is divided and written to memory cells which are connected to different word lines.

6. The semiconductor storage device according to claim 1, wherein when the series of data is written to the plurality of memory cells in accordance with the writing command, the series of data is divided into a plurality of data units, and written in a time-sharing manner for each of the plurality of data units.

7. The semiconductor storage device according to claim 2, wherein when the predetermined data is being written to the memory cells, the erasing operation control circuit outputs a busy signal to outside.

8. The semiconductor storage device according to claim 7, further comprising:
a timer circuit for measuring a period of time in which the busy signal is output.

9. The semiconductor storage device according to claim 2, further comprising:
a capacitor element connected to a power supply terminal,
wherein when a power supply is shut off, the erasing operation control circuit writes the predetermined data by a charge stored in the capacitor element.

10. A semiconductor storage device comprising:
a memory cell array having a plurality of word lines, a plurality of bit lines which intersect with the plurality of word lines, and a plurality of first and second memory cells disposed at predetermined intersections between the plurality of word lines and the plurality of bit lines;
a dummy data pattern block;
a selection circuit which selects data output from the memory cell array and data output from the dummy data pattern block; and
a command control circuit which controls writing and reading operations to and from the memory cell array,
wherein each of the plurality of second memory cells includes:
a tunnel magnetoresistive element having a tunnel film, a pinned layer which is placed adjacent to the tunnel film and whose electron spin direction is fixed to a predetermined direction, and a free layer which is placed adjacent to a surface of the tunnel film which is opposed to the surface adjacent to the pinned layer and whose electron spin direction is set either in parallel with or in anti-parallel with the pinned layer; and
a MOSFET whose gate is connected to the word line and whose drain is connected to the pinned layer side of the tunnel magnetoresistive element,
wherein each of the plurality of first memory cells retains information indicating that a corresponding one of the plurality of second memory cells is in a writing state or information indicating that the corresponding one of the plurality of second memory cells is in an erasing state, and
wherein when the command control circuit receives a reading command containing an address signal which indicates from which memory cells among the plurality of second memory cells the data is to be read, if the information retained by the first memory cell corresponding to the address signal among the plurality of first memory cells indicates the writing state, the selection circuit selects the data output from the plurality of second memory cells, and if the information retained by the first memory cell corresponding to the address signal among the plurality of first memory cells indicates the erasing state, the selection circuit selects the data output from the dummy pattern data block.

11. The semiconductor storage device according to claim 10,
wherein when the command control circuit receives a writing command containing an address signal which indicates to which memory cells among the plurality of second memory cells a writing operation is to be carried out, the command control circuit writes the information indicating the writing state to the first memory cells among the plurality of first memory cells corresponding to the address signal, and also writes input data to the second memory cells indicated by the address signal, and
when the command control circuit receives an erasing command containing an address signal which indicates which memory cells among the plurality of second memory cells are erased, the command control circuit writes the information indicating the erasing state to the first memory cells among the plurality of first memory cells corresponding to the address signal and writes no information to the plurality of second memory cells.

12. The semiconductor storage device according to claim 10,
wherein the plurality of first memory cells are volatile memory cells, and when power is applied to the semiconductor storage device, the first memory cells retain the information indicating the erasing state.

13. The semiconductor storage device according to claim 10,
wherein the dummy pattern data block is constituted by as many inverter rows as the number of bits of the data to be written.

14. The semiconductor storage device according to claim 10,
wherein when the predetermined data is being written to the memory cells, the command control circuit outputs a busy signal to outside.

15. The semiconductor storage device according to claim 14, further comprising:
a timer circuit for measuring a period of time in which the busy signal is output.

16. The semiconductor storage device according to claim 10, further comprising:
a capacitor element connected to a power supply terminal,
wherein when a power supply is shut off, the command control circuit writes the information indicating the erasing state to the plurality of first memory cells by a charge stored in the capacitor element.

17. A semiconductor storage device comprising:
a memory cell array having a plurality of word lines, a plurality of bit lines which intersect with the plurality of word lines, and a plurality of first and second memory cells disposed at predetermined intersections between the plurality of word lines and the plurality of bit lines; and
a command control circuit which controls writing and reading operations to and from the memory cell array,
wherein each of the plurality of first memory cells includes:
a tunnel magnetoresistive element having a tunnel film, a pinned layer which is placed adjacent to the tunnel film and whose electron spin direction is fixed to a predetermined direction, and a free layer which is placed adjacent to a surface of the tunnel film which is opposed to the surface adjacent to the pinned layer and whose electron spin direction is set either in parallel with or in anti-parallel with the pinned layer; and
a MOSFET whose gate is connected to the word line and whose drain is connected to the pinned layer side of the tunnel magnetoresistive element,
wherein the first memory cells and the second memory cells are different types of memory cells so that each of the plurality of first memory cells has an information retention period which is longer than an information retention period of each of the plurality of second memory cells, and
wherein when the command control circuit receives a writing command containing an address signal which indicates to which memory cells among the plurality of first memory cells and/or second memory cells a writing operation is to be carried out, the command control circuit writes data input from outside to the first memory cells and the second memory cells indicated by the address signal in a divided manner among the plurality of first memory cells and the plurality of second memory cells.

18. The semiconductor storage device according to claim 17,
wherein the plurality of second memory cells are volatile memories.

19. The semiconductor storage device according to claim 17,
wherein the plurality of first memory cells and the plurality of second memory cells are connected to different word lines.

20. The semiconductor storage device according to claim 17, further comprising:
an erasing operation control circuit which controls an erasing operation to the memory cell array,
wherein when the erasing operation control circuit receives an erasing command containing an address signal which indicates which memory cells among the plurality of first and second memory cells are to be erased, the erasing operation control circuit writes predetermined data to the second memory cells among the plurality of second memory cells indicated by the address signal in accordance with the erasing command, thereby completing the erasing operation.

21. The semiconductor storage device according to claim 17,
wherein the plurality of first memory cells differs from the plurality of second memory cells in that one plurality are static memory cells and the other plurality are dynamic memory cells.

* * * * *